United States Patent [19]

Naylor

[11] Patent Number: 4,567,463
[45] Date of Patent: Jan. 28, 1986

[54] CIRCUIT FOR IMPROVING THE PERFORMANCE OF DIGITAL TO ANALOG CONVERTERS

[75] Inventor: Jimmy R. Naylor, Tucson, Ariz.

[73] Assignee: Burr-Brown Corporation, Tucson, Ariz.

[21] Appl. No.: 351,542

[22] Filed: Feb. 23, 1982

[51] Int. Cl.[4] .................................... H03K 13/02
[52] U.S. Cl. ................... 340/347 DA; 340/347 CC; 340/347 M
[58] Field of Search ............. 340/347 AD, 347 DA, 340/347 CC, 347 M

[56] References Cited

U.S. PATENT DOCUMENTS

| | | | |
|---|---|---|---|
| 3,961,326 | 6/1976 | Craven | 340/347 DA |
| 4,092,639 | 5/1978 | Schoeff | 340/347 DA |
| 4,292,625 | 9/1981 | Schoeff | 340/347 DA |

FOREIGN PATENT DOCUMENTS 1124660 8/1968 United Kingdom .

OTHER PUBLICATIONS

The Engineering Staff of Analog Devices, Inc., Analog–Digital Conversion Handbook, 6/1972, pp. I-2 to I-5; II-32 to II-39; II-162 to II-168.
Millman et al, Pulse and Digital Circuits, McGraw-Hill Book Co., Inc., 1956, pp. 559-567.
IEEE Spectrum, Applications Literature, CMOS Bipolar D/A Converters . . . , 12/1972, (03 NL F92).

Primary Examiner—T. J. Sloyan
Attorney, Agent, or Firm—Weiss & Holloway

[57] ABSTRACT

In a digital to analog converter, a circuit for improving the performance of digital to analog converters by reducing and minimizing the variation in analog ground current is disclosed. The resulting digital to analog converter has reduced variation in output signal, the digital to analog converter can provide a more accurate representation of the input digital signal.

11 Claims, 9 Drawing Figures

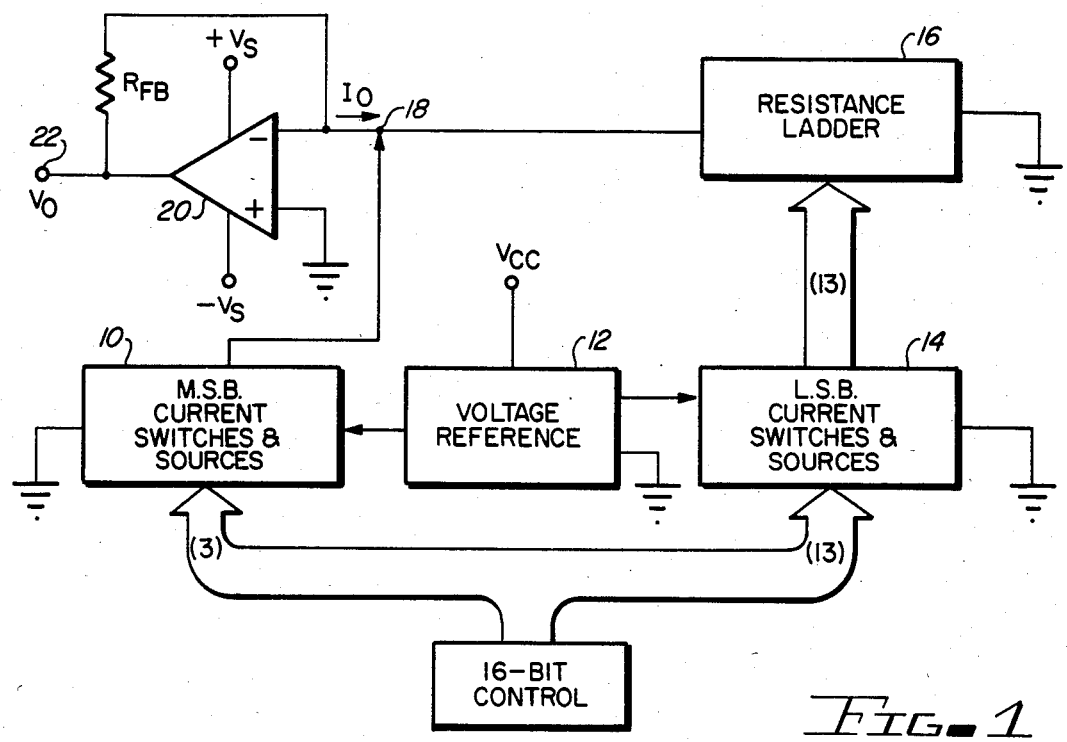
Fig-1
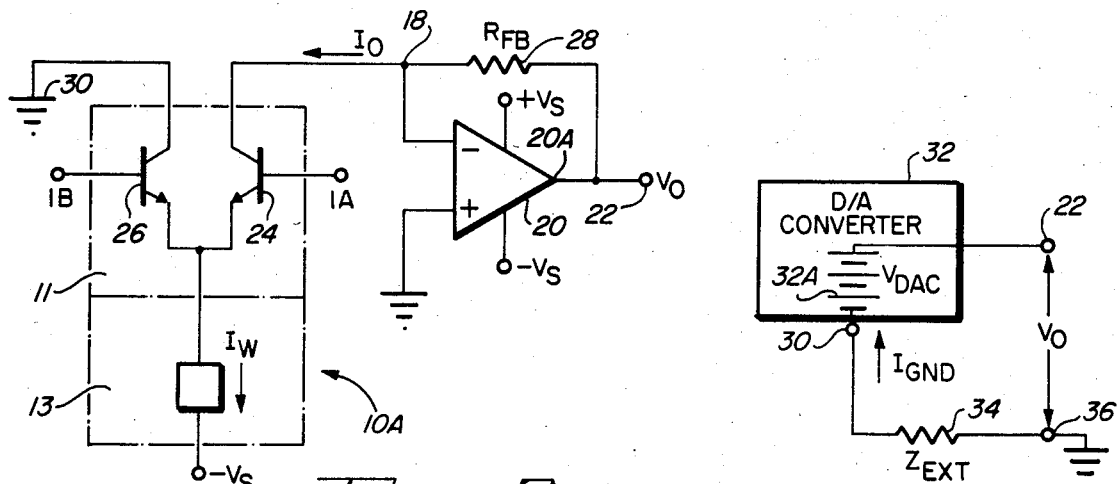
Fig-2
Fig-3
(1) $V_O = V_{DAC} - I_{GND} Z_{EXT}$
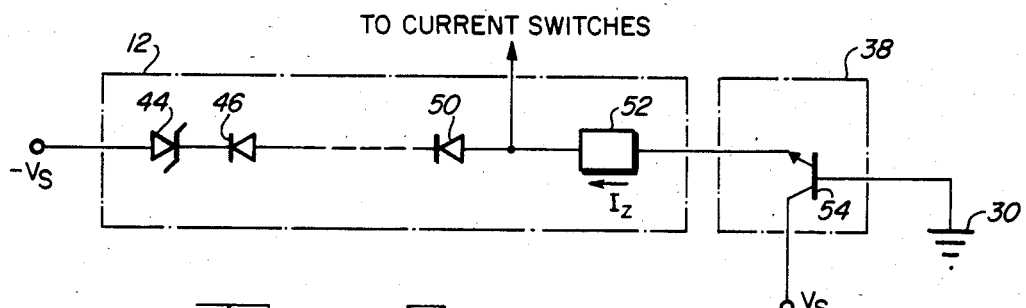
Fig-5

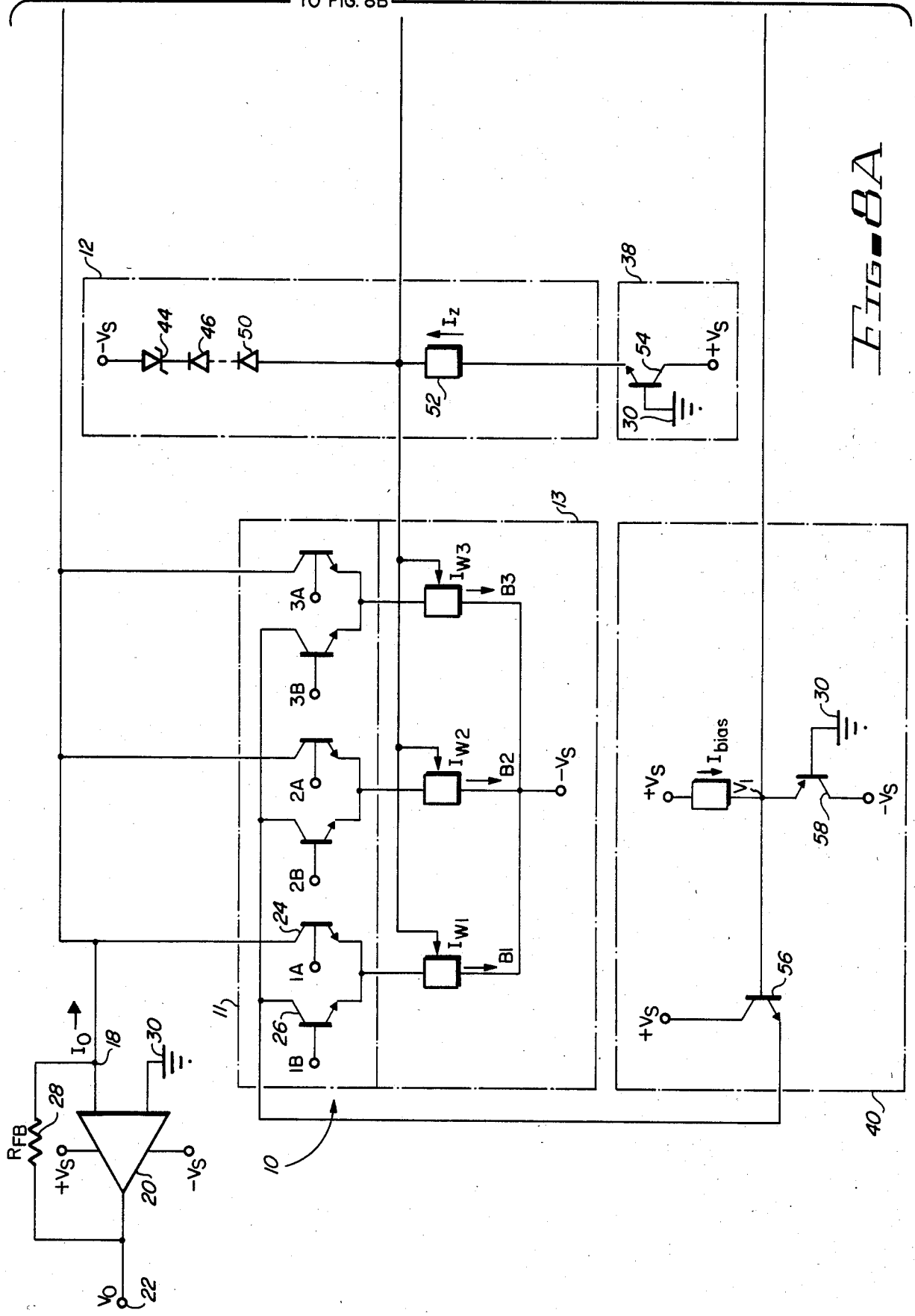

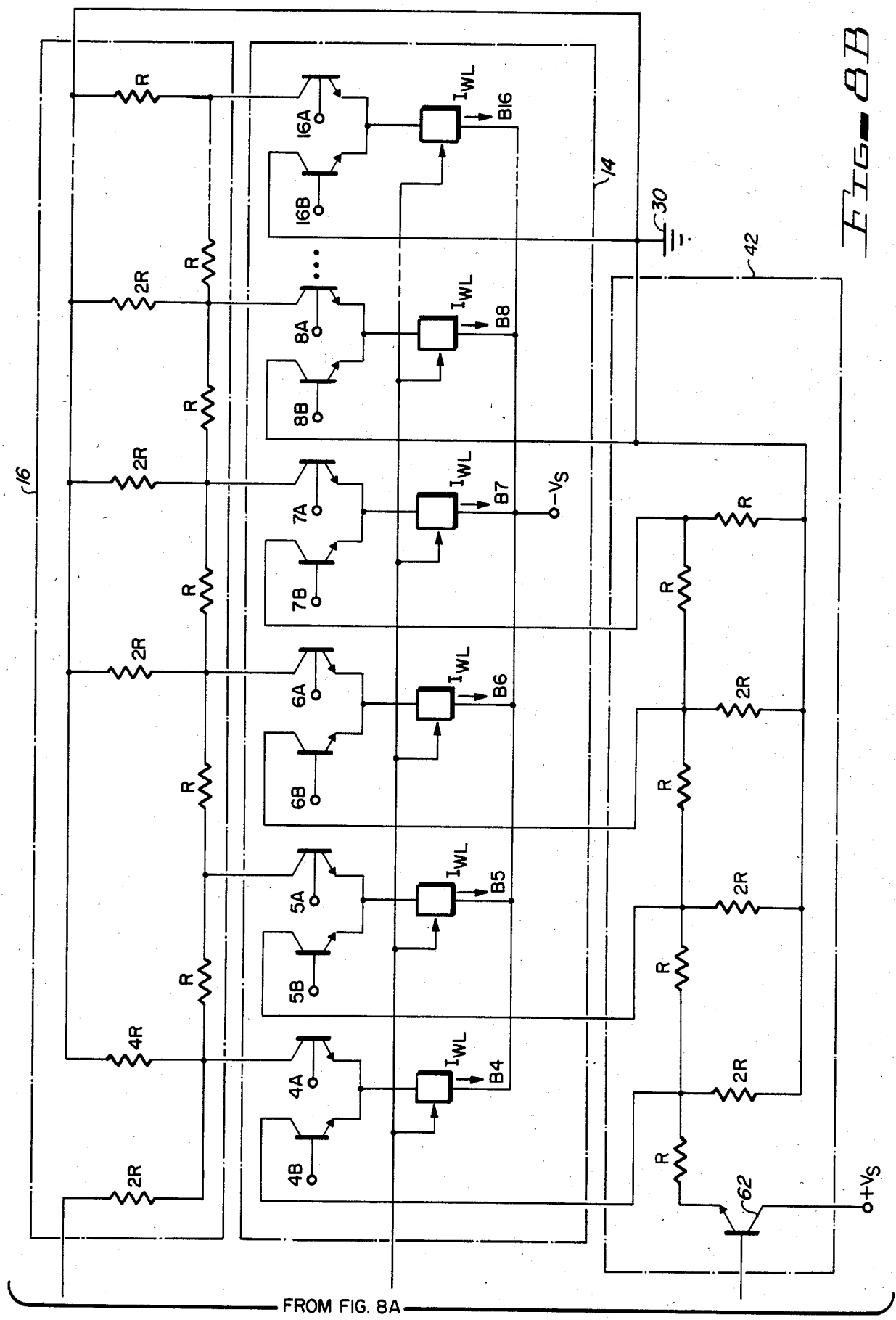

CIRCUIT FOR IMPROVING THE PERFORMANCE OF DIGITAL TO ANALOG CONVERTERS

BACKGROUND OF THE INVENTION

1. Field of the Invention

This invention relates generally to digital to analog converters (DACs), and more specifically, to a circuit which improves the accuracy of DACs by reducing the unwanted change in the output voltage of the DAC by minimizing the variation in analog ground current flowing through extraneous package, lead and contact resistances.

2. Description of the Prior Art

Shown in FIG. 1 is a block diagram of a conventional 16-bit monolithic DAC. A 16-bit control line is divided into most significant bits (MSB) and least significant bits (LSB). The three MSBs are coupled to individual current switches 11 and current sources 13 (in FIG. 2), which are referenced generally by block 10. The thirteen LSBs are also coupled to current switches and current sources, which are referenced generally by the block 14. The three MSB current switches and current sources 10 may be comprised of three binary weighted current sources which are each coupled to a current switch. Alternatively, the MSB current switches and current sources 10 may be comprised of seven equally weighted current sources which are switched on and off in combinations to provide the required output which corresponds to having a particular code on the three most significant bit control lines. There are commonly known advantages to both methods of implementing the MSB current switches and current sources, and the choice of which to incorporate into a DAC is dependant upon the desires of the circuit designer.

The LSB current sources are all weighted equally, and are coupled to a R-2R resistance ladder 16 through the current switches. The resistance ladder 16 divides the LSB current sources into binary weights which are summed with the weighted output of the MSB current switches 10 at output summing point 18. The MSB and LSB current sources 10 and 14, respectively, are biased by a voltage reference circuit 12. Finally, in a conventional DAC, an output amplifier 20 converts the output current $I_o$ at summing point 18 to an output voltage $V_o$ at its output 22.

Thus, a conventional 16-bit DAC receives a 16-bit digital signal and converts each bit of the signal into a corresponding current weight which is summed and converted into an analog output voltage.

Shown in FIG. 2 is a more detailed circuit representation of a MSB current switch and current source referenced earlier as block 10. For clarity, the block 10A has been subdivided into a current switch 11 and a current source 13.

The current switch 11 is a single-pole double-throw type comprised of a differential pair of transistors 24 and 26. The emitters of transistors 24 and 26 are coupled together and to the current source 13. The base of each transistor is controlled by the appropriate line of the 16-bit digital input signal at inputs 1A and 1B. Transistor 24 is henceforth called the "ON" transistor, and transistor 26 is called the "OFF" transistor. The collector of transistor 24 is coupled to the summing junction 18. The collector of transistor 26 is usually coupled to ground. The other side of the current source 13 is conventionally coupled to the negative supply $-V_s$. Referring to 10A as a general guideline for any particular bit, the following happens when a particular bit is turned on in a conventional DAC. Signals will be applied at 1A and 1B of 10A which are generated from the appropriate bit control line, so that "ON" transistor 24 will be turned on and "OFF" transistor 26 will be turned off. The current $I_w$ will originate at the positive supply $+V_s$, flow through the internal circuitry of the operational amplifier 20, then from the op amps output terminal 20A, through the feedback resistor 28, through the "ON" transistor 24 and current source 13, and finally to the negative supply $-V_s$. The value of the weighted current $I_w$ of the specific bit will appear at the summing junction 18 and as an output voltage $V_o$ (which is equal to the product of feedback resistor 28 and $I_w$) at the output 22 of amplifier 20. It will appear as the product because the voltage differential between the negative and positive inputs to the amplifier 20 will be zero, with the value of the voltage at the inputs being held to that of analog ground (the positive input).

Problems in conventional DACs arise when a particular bit is in a turned off mode (i.e. transistor 24 off and transistor 26 on). When a particular bit of the DAC is not on, transistor 26 is biased on and current flows from analog ground, through transistor 26 and current source 13, to $-V_s$. Thus, the value of the weighted current, $I_w$, does not appear at the summing junction 18. However, when a bit is switched from an on to an off mode, a contribution by that bit to the current in analog ground 30 appears where there was previously not one. The changing value of the current flowing in analog ground 30 results in undesirable voltage errors at the output 22 of the DAC, when extraneous impedance 34 exists in analog ground as shown in FIG. 3.

The equation in FIG. 3 demonstrates the effect of changing analog ground currents and the need to keep the magnitude of the analog ground current below a defined maximum amount, and also to keep analog ground current changes (when the bits are switched) below a maximum value. The 16-bit DAC is represented by block 32. The output of the DAC 32 is shown at node 22 and represented by $V_o$. The analog circuit ground of the DAC is shown at node 30 with the current symbol $I_{gnd}$ representing the current which flows through the analog ground. In a usual application, whether at a testing or packaging stage by the manufacture, or being used by the customer, there will be a system ground 36 and some extraneous wiring, contact or packaging impedance 34, labeled $Z_{ext}$. The effect of an analog ground circuit $I_{gnd}$ is to alter the ideal voltage output of the DAC 32 by the amount equal to the product of $I_{gnd}$ and $Z_{ext}$, where $V_{DAC}$ (represented by a battery 32A) is the desired ideal output voltage of the DAC. Thus, the output voltage $V_o$ of the DAC 32 contains an error value of the ideal DAC output voltage $V_{DAC}$ node 22.

In conventional DACs, the error voltage ($I_{gnd} \times Z_{ext}$) varied as $I_{gnd}$ varied as explained above. A varying error voltage limited accurate use of the DAC. Wiring inductance caused time dependent error voltages which resulted in extended time before the DAC output would settle to its final value. Thus, there existed a need to design a DAC which would reduce and hold the analog ground current constant below a maximum value as the digital input values changed.

SUMMARY OF THE INVENTION

It is an object of this invention to provide an improved DAC which has greater accuracy and versatility of application.

It is another object of this invention to provide an improved DAC by reducing and holding constant below a maximum value the analog ground current of the DAC.

It is still another object of this invention to provide an improved DAC by reducing and holding constant below a maximum value the error voltage at the output of the DAC.

It is yet another object of this invention to provide an improved DAC by reducing the effects of extraneous analog ground impedance so as to assure overall linearity of the DAC.

It is another object of this invention to provide an improved DAC which allows for more accurate testing during its fabrication so as to improve product yield.

It is yet another object of the invention to provide an improved DAC by reducing the effects of extraneous analog ground impedance so as to assure fast settling of the DAC to it's desired output value.

Finally, it is an object of this invention to provide an improved DAC which removes common wiring restraints imposed on customers by reducing the affect of wiring impedance between the DAC's analog ground pin and the customer's system analog ground on the performance of the DAC.

The above and other objects are achieved in a digital to analog converter which reduces output voltage changes due to fluctuations in analog ground current, comprising in combination:

most significant bit current switch and source means for providing at least one most significant bit current switch and source;

least significant bit current switch and source means for providing at least one least significant bit current switch and source;

voltage reference means coupled to both said most significant bit current switch and source means and said least significant bit current switch and source means for providing a bias potential;

primary resistance network means coupled to said least significant bit current switch and source means for scaling a current output from said least significant bit current switch and source means;

secondary resistance network means to said least significant bit current switch and source means for cooperating with said primary resistance network means to reduce changes in analog ground current;

voltage reference buffer means coupled to said voltage reference means for reducing current in analog ground; and most significant bit ground buffer means coupled to said most significant bit current switch and source means for reducing a current flowing from analog ground through said most significant bit current switch and source means.

BRIEF DESCRIPTION OF THE DRAWINGS

FIG. 1 is a block diagram of a conventional 16-bit digital to analog converter.

FIG. 2 is a circuit diagram of one bit of the most significant bit current switches and sources shown in FIG. 1.

FIG. 3 is a block diagram and equation demonstrating the effect of changing analog ground currents.

FIG. 5 is a circuit diagram demonstrating the voltage reference and voltage reference ground buffer circuits shown in FIG. 4.

FIG. 8 (FIGS. 8A and 8B taken together) is a circuit representation of the block diagram of FIG. 4.

THE SPECIFICATION

Figure 4:
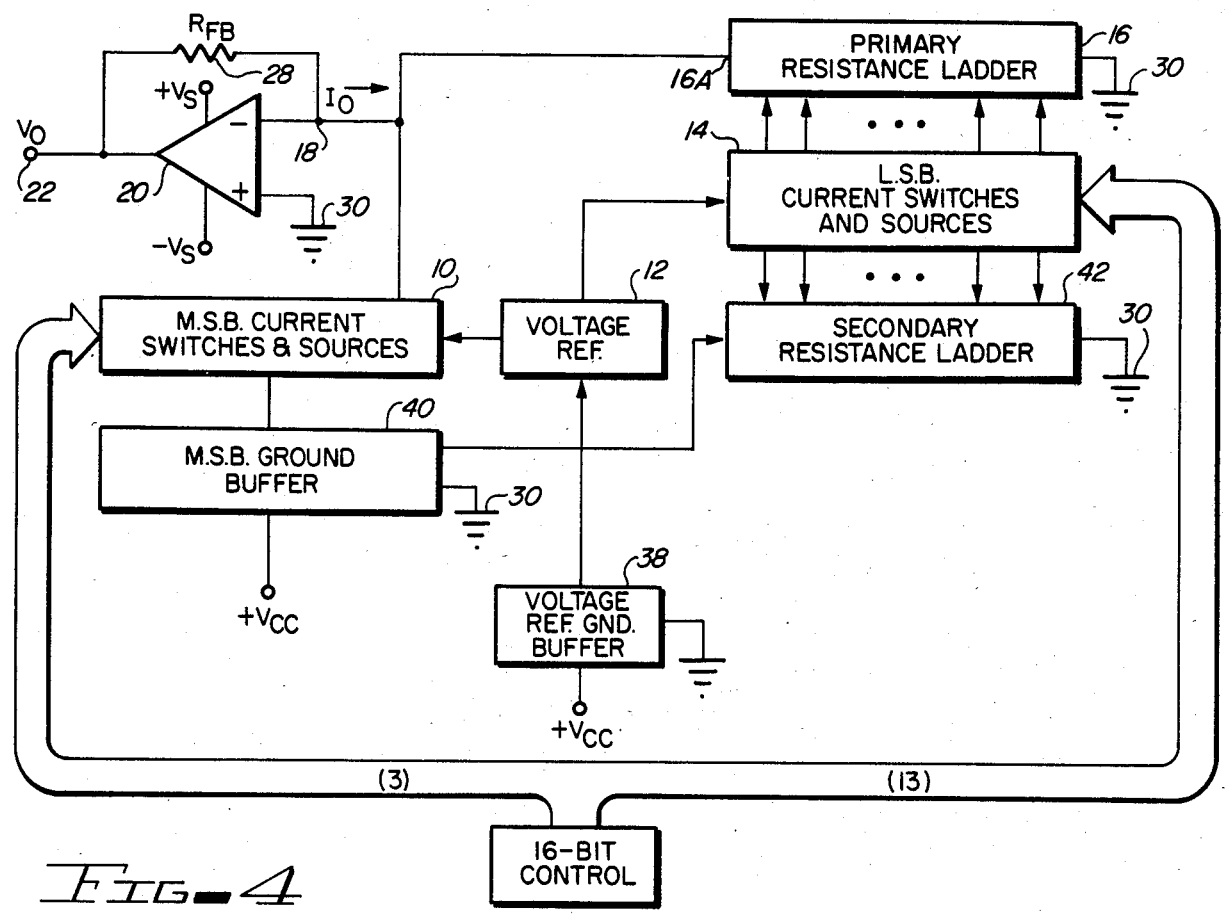
FIG. 4 is a block diagram of the improved digital to analog converter.

Referring to FIG. 4, a block diagram is shown which represents an improved digital to analog converter (DAC). Blocks functioning similarly to those of FIG. 1 are correspondingly numbered. The most significant bits (MSB) of the DAC are comprised of current switches and weighted current sources referenced generally by block 10. The least significant bits (LSB) of the DAC are comprised of individual current switches and similarly weighted current sources, referenced by block 14, which are scaled by a primary resistance ladder referenced by block 16. The voltage reference for the MSB and LSB current sources is supplied by a voltage reference circuit 12. The MSB current switches are controlled by 3 bits of a 16-bit digital control line. The LSB current switches are controlled by the remaining 13 bits of the same 16-bit digital control line. The outputs of the MSB current switches and current sources 10 and the output of the primary resistance ladder 16 are summed at the current summing node 18. The output current $I_o$ at node 18 is converted by op-amp 20 into the analog output voltage $V_o$ at output node 22.

The voltage reference circuit 12 has its analog ground current buffered by a voltage reference ground buffer 38. The MSB current switches and sources 10 has its analog ground current buffered by the MSB ground buffer circuit of block 40. A secondary resistance ladder 42 operates to reduce the change in the analog ground current caused by the alternating LSB current switches and current sources 14.

Referring to FIG. 5, a circuit is shown which functions as the voltage reference buffer 38 referenced above in FIG. 4. A conventional voltage reference circuit 12 is shown as being comprised of a voltage zener diode 44 having one end coupled to the negative supply $-V_s$. The other side of the zener diode 44 is coupled to the series connection of a plurality of compensation diodes, represented by diodes 46 and 50. The positive side of the last series diode 50 is coupled to a current source 52 and represents the biasing current $I_z$ which is supplied to the compensation diodes 46 and 50 and the zener diode 44. The voltage across these diodes 44, 46, and 50 serve to bias the current sources in the MSB and LSB circuits 10 and 14.

A conventional voltage reference circuit would couple the positive side of current source 52 to the analog ground 30. However, to reduce unwanted current in the analog ground, the positive side of current source 52 is coupled to the emitter of transistor 54 which comprises part of buffer 38. The base of transistor 54 is coupled to analog ground. The collector of transistor 54 is coupled to the positive supply $+V_s$. Thus, the majority of current flowing through voltage reference 12 originates from $+V_s$ and not from the analog ground. The result is to reduce the contribution of the current $I_z$ that flows in analog ground to an amount equal to $I_z$ divided by the current gain (Beta) of transistor 54.

Figure 6:
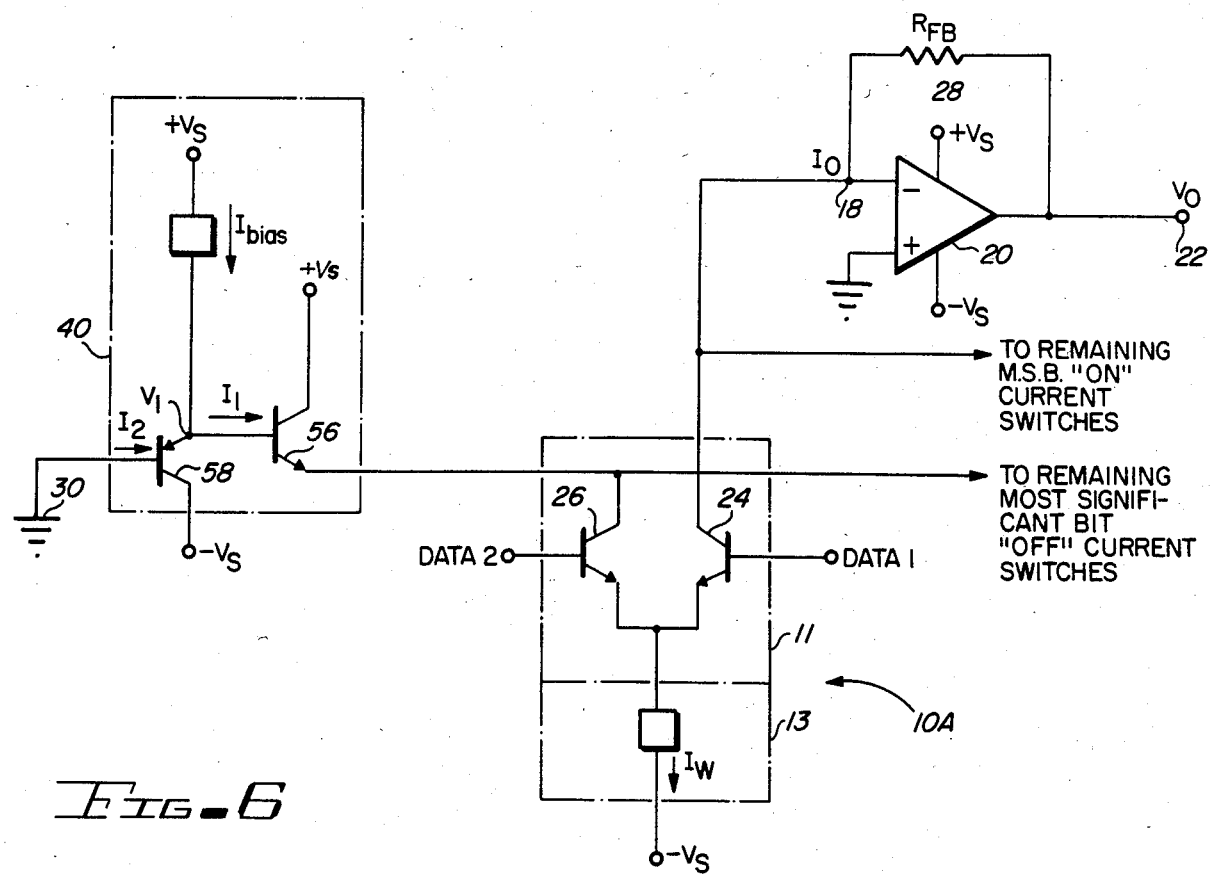
FIG. 6 is circuit diagram similar to that of FIG. 2 including the most significant bit ground buffer shown in FIG. 4.

Referring to FIG. 6, a circuit is shown which functions as the MSB ground buffer 40 shown in FIG. 4. As can be seen, a portion of the circuit is configured in a manner similar to that of FIG. 2, with corresponding elements similarly referenced. However, the collector of transistor 26 of current switch 11 is not coupled to analog ground. Instead, the collector of transistor 26 is coupled to the emitter of transistor 56 of most significant bit ground buffer 40. The collector of transistor 56 is coupled to the positive voltage supply. Thus, a majority of the current $I_w$ which flows through transistor 26 when it is turned on originates from the positive supply $+V_s$ at the collector of transistor 56.

The amount of current $I_1$ flowing in the base of transistor 56 is equal to the weighted current $I_w$ divided by the beta of transistor 56. To further isolate the analog ground 30 from the effects of the switching current sources, a second transistor 58 (which is a PNP transistor) is used to further divide the current $I_1$. The base of transistor 56 is coupled to the emitter of transistor 58. The emitter of transistor 58 is biased by a current source $I_{bias}$. The collector of transistor 58 is coupled to the negative supply $-V_s$. The base of transistor 58 is coupled to analog ground 30. The contribution of current $I_2$ (which is due to $I_w$) flowing from analog ground is equal to the weighted current $I_w$ divided by the product of the betas of transistor 58 and the beta of transistor 56.

One of the effects of the MSB ground buffer 40 is to reduce the amount of current flowing from analog ground through the plurality of MSB current switches (only one of which is shown). As a result, the amount of fluctuation in the analog ground current when the transistors 24 and 26 are switching on and off is reduced. In addition, by using a PNP transistor 58 and an NPN transistor 56 combination, the voltage at the collector of transistor 26 when it is turned on is the sum of the base to to emitter voltages from transistor 58 and 56. Thus, the emitter of transistor 56 is at approximately ground potential. The voltage at the collector of transistor 24 is simularily approximately zero volts, because the voltage differential between the + and − inputs of amplifier 20 will be zero, since the + input is tied to analog ground. Since the collectors of both transistors 24 and 26 are at the same voltage they dissipate the same amount of power when turned on. As a result the current source 13 (which is affected by the thermally generated heat of the nearby transistor switches 24 and 26) will be affected equally by transistor switches 24 and 26 since they each dissipate the same power when turned on, thus another potential source of error is reduced.

Figure 7:
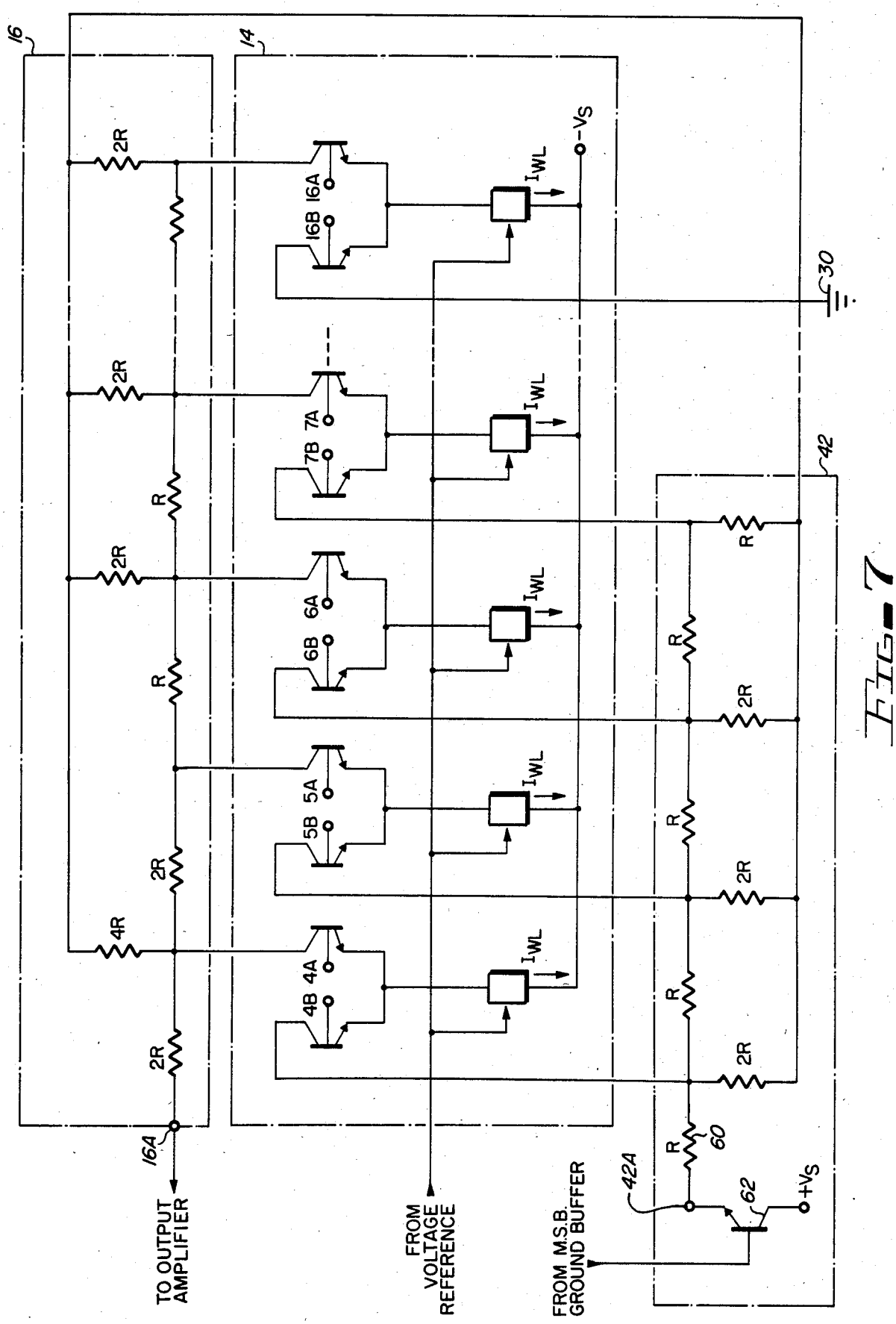
FIG. 7 is a circuit diagram showing the configuration of the least significant bit current switches and sources, the primary resistance ladder and the secondary resistance ladder shown in FIG. 4.

Shown in FIG. 7 is a circuit which functions as the secondary ladder 42 shown in FIG. 4. In conventional DACs, connections from the "OFF" transistors in block 14 are made directly to analog ground instead of to a secondary ladder 42 as shown in FIG. 7. Therefore, when a bit was turned off, all of the current from a current source $I_{WL}$ originated from analog ground 30. However, when a bit was turned on a lesser amount of the current $I_{WL}$ originated from analog ground 30. The balance of the current $I_{WL}$ originated from $+V_s$ flowing through op amp 20, through $R_{fb}$ 28, and then into the output node 16A of the primary resistance ladder 16.

The effect of switching the current sources was to cause fluctuating analog ground currents thus producing error voltages at the output of conventional DACs.

The secondary ladder 42 provides a means for duplicating the current flowing in analog ground when the current switches 14 are in either an on or off state. Thus, when any given bit current switch in 14 is off, a current equal to that which flowed in analog ground and the primary ladder 16 when the switch was on also flows from analog ground through the secondary ladder 42 and the "OFF" transistor of switch 14. The effect is to assure a constant analog ground current regardless of the current switches 14 changing from an on to an off state or vice versa. The output resistor 60 of secondary ladder 42 is coupled to the emitter of a buffer transistor 62. The collector of transistor 62 is coupled to $+V_s$, so that current into the output node 42A of the secondary ladder 42 originates from $+V_s$ in the same way that a current into the output node 16A of the primary resistance ladder 16 originates from $+V_s$. The base of transistor 62 is coupled to the emitter of transistor 58 of the most significant bit ground buffer 40, so that the potential at the emitter of transistor 62 will be near zero volts.

It can also be seen that only the first four bits (B4 through B7) of the least significant bits are coupled to the secondary ladder 42. If a greater or lesser degree of accuracy is desired, either a greater number or a fewer number of the bits can be connected to an enlarged or reduced secondary ladder, respectively.

Shown in FIG. 8 is a circuit which functions as the block diagram described in FIG. 4 and includes the circuits of FIGS. 5, 6 and 7. The circuit of FIG. 8 shows generally how the elements of the block diagram of FIG. 4 interrelate. The most significant bit current switches and sources are represented generally by the numeral 10. In this circuit there are three most significant bits B1, B2 and B3, having weighted current sources 13, represented by $I_{w1}$, $I_{w2}$ and $I_{w3}$, respectively. The current source of each bit is coupled to a single-pole double-throw switch. The three switches are referenced generally by the block 11, and are comprised of an "ON" transistor 24 and an "OFF" transistor 26 as described when referencing FIG. 6. The "ON" transistors 24 are coupled to the summing junction 18 and are controlled at their bases by data lines 1A, 2A and 3A. The "OFF" transistors 26 are coupled to the MSB ground buffer 40 and are controlled at their bases by data lines 1B, 2B and 3B, respectively. Thus, as described earlier, when any combination of the "ON" transistors 24 are on, a current path exists from $+V_s$ through amplifier 20, through feed back resistor $R_{fb}$ 28 and the "ON" transistor, to the negative supply $-V_s$. The current through the "OFF" transistors 26, when they are biased on, is primarily sourced from the positive supply $+V_s$ at the collector of transistor 56 (which is biased on at its base by the biasing current $I_{bias}$) through the "OFF" transistor and current source, to the negative supply. Analog ground 30 is essentially isolated by the betas of transistor 56 and 58 of buffer circuit 40 from the switching effects of the most significant bits B1, B2 and B3. The biasing current $I_{bias}$ of MSB buffer 40 also biases the buffer transistor 62 of the secondary ladder 42.

The least significant bits B4 through B16 are shown within block 14 (bits 9 through 15 have been omitted as being repetitious). The current sources of the least significant bits are weighted identically and are represented by $I_{WL}$. The current flowing from each bit's current source, when the "ON" transistors have been turned on (by data lines 4A through 16A), is divided by the ladder network 16. Note that the current path is from analog ground 30 through the resistor network, the "ON" transistor and current source, to the negative supply $-V_s$. Similarly, the first four bits of the least significant bits, B4, B5, B6 and B7, are coupled to a R-2R ladder network 42 as described when referencing FIG. 7.

Finally, the voltage reference circuit 12 sets up the biasing voltage for the current switches of both the MSB and the LSB circuits. In addition, voltage reference buffer 38 operates to reduce the analog ground 30 from the zener biasing current $I_z$ by pulling most of the current from the positive supply $+V_s$.

The above description is given by way of example only. Changes in form and details may be made by one skilled in the art without departing from the scope of the invention as defined by the appended claims.

What is claimed is:

1. A digital to analog converter comprising:
   most significant bit current switches and sources;
   least significant bit current switches and sources;
   a primary resistance network coupled to said least significant bit current switches and sources and to a ground terminal, said primary resistance network having an output coupled to said most significant bit current switches, each of said least significant bit current switches and sources applying current to said primary resistance network when said each least significant bit current switches and sources are in a first state;
   most significant bit ground buffer means coupled to said most significant bit current switches and sources for reducing a current flowing from analog ground through said most significant bit current switches; and
   secondary resistance network means coupled to said least significant bit current switches and sources and to said ground terminal, each of said least significant bit current switches and sources applying current to said secondary resistance means, said secondary resistance network means for providing an analog ground current contribution when said each least significant bit current switch and source is in a second state generally equal to an analog ground current contribution.

2. The digital to analog converter of claim 1 further comprising:
   most significant bit ground buffer means coupled to said most significant bit current switches and sources for reducing current flowing from analog ground through said most significant current switches.

3. The digital to analog converter of claim 1 further comprising:
   a voltage reference network coupled to said least significant bit current switches and sources; and
   voltage reference buffer means coupled to said voltage reference network for reducing current in analog ground.

4. A digital to analog converter which reduces output voltage changes due to fluctuations in analog ground current, comprising:
   most significant bit current switch and source means for providing at least one most significant bit current switch and source;
   least significant bit current switch and source means for providing at least one least significant bit current switch and source;
   voltage reference means coupled to both said most significant bit current switch and source means and said least significant bit current switch and source means for providing a bias potential;
   primary resistance network means coupled to said least significant bit current switch and source means for scaling a current output from a least significant bit current switch when said least significant switch is activated, said current output providing a contribution to an analog ground current;
   secondary resistance network means coupled to said least significant bit current switch and source means for providing said contribution to said analog ground current when said least significant bit current switch is inactivated;
   voltage reference buffer means coupled said voltage reference means for reducing current in analog ground; and
   most significant bit ground buffer means coupled to said most significant bit current switch and source means for reducing a current flowing from analog ground through said most significant current switch and source means.

5. The digital to analog converter in accordance with claim 4 wherein said most significant bit ground buffer means comprises:
   current generating means for establishing a biasing current;
   a npn transistor coupled at its base to said current generating means, said npn transistor having its collector coupled to a positive supply voltage and its emitter coupled to each one of said most significant bit current switches; and
   a pnp transistor coupled at its emitter to said current generating means, said pnp transistor having its base coupled to analog ground and its collector coupled to a negative voltage supply.

6. The digital to analog converter in accordance with claim 5, wherein one of said most significant bit current switches in a single-pole, double-throw switch including a pair of differential transistors, said npn transistor coupled at its emitter to one transistor of said pair of differential transistors in said single-pole, double-throw switch.

7. The digital to analog converter in accordance with claim 6, wherein said secondary resistance network means is comprised of:
   current generating means for establishing a biasing current;
   R-2R resistance ladder network means coupled to said least significant bit current switches for dividing analog ground current;
   an output resistor coupled to said R-2R resistance ladder network means; and
   buffer transistor means coupled to said output resistor and to said current generating means for buffing the output of said R-2R resistance ladder network means.

8. The digital to analog converter in accordance with claim 7 wherein one of said least significant bit current switches is a single-pole, double throw switch including a pair of differential transistors, said R-2R resistance ladder network means coupled to one transistor of said pair of differential transistors in said single-pole, double throw switch.

9. The digital to analog converter in accordance with claim 8 wherein said buffer transistor means is comprised of a npn transistor, said npn transistor having its emitter coupled to said output resistor, its collector coupled to a positive supply voltage, and its base coupled to the current generating means in said most significant bit ground buffer means.

10. The digital to analog converter in accordance with claim 4, wherein said voltage reference buffer means is comprised of: transistor means coupled to said voltage reference network for reducing current flowing in analog ground equal to the inverse of the current gain of said transistor means.

11. The digital to analog converter in accordance with claim 10, wherein said transistor means is comprised of a npn transistor coupled at its emitter to said voltage reference means, said npn transistor coupled at its collector to a positive voltage supply and its base to analog ground.

* * * * *